US010386865B2

(12) United States Patent
Cartwright et al.

(10) Patent No.: US 10,386,865 B2
(45) Date of Patent: Aug. 20, 2019

(54) LIQUID LEVEL CONTROL LOOP OPTIMIZER

(71) Applicant: FISHER CONTROLS INTERNATIONAL LLC, Mashalltown, IA (US)

(72) Inventors: Carter B. Cartwright, Ames, IA (US); Mitchell S. Panther, Marshalltown, IA (US); Jordan E. Mandernach, Adel, IA (US); Melissa R. Niesen, Ames, IA (US)

(73) Assignee: FISHER CONTROLS INTERNATIONAL LLC, Marshalltown, IA (US)

( * ) Notice: Subject to any disclaimer, the term of this patent is extended or adjusted under 35 U.S.C. 154(b) by 949 days.

(21) Appl. No.: 14/502,105

(22) Filed: Sep. 30, 2014

(65) Prior Publication Data

US 2015/0090342 A1 Apr. 2, 2015

Related U.S. Application Data

(60) Provisional application No. 61/884,563, filed on Sep. 30, 2013.

(51) Int. Cl.
*G06F 17/50* (2006.01)
*G05D 9/12* (2006.01)
*G05B 13/04* (2006.01)

(52) U.S. Cl.
CPC ............ *G05D 9/12* (2013.01); *G05B 13/04* (2013.01); *G06F 17/50* (2013.01); *Y10T 137/0324* (2015.04)

(58) Field of Classification Search
CPC .................................................. G06F 17/5022
USPC ........................................................... 703/13
See application file for complete search history.

(56) References Cited

U.S. PATENT DOCUMENTS

| 5,455,763 | A | 10/1995 | Feingold |
| 6,201,701 | B1* | 3/2001 | Linden ................. H05K 1/0206 174/252 |
| 6,721,609 | B1 | 4/2004 | Wojsznis et al. |
| 2002/0163089 | A1* | 11/2002 | La Crosse ............. B01F 3/0446 261/76 |

(Continued)

OTHER PUBLICATIONS

Fredrik Soderberg, A Study of Fluid Flow and Combustion with Variable Valve Timing (Year: 1998).*

(Continued)

*Primary Examiner* — Lechi Truong
(74) *Attorney, Agent, or Firm* — Marshall, Gerstein & Borun LLP

(57) ABSTRACT

A liquid level control loop optimizer receives a selection of a vessel configuration and a variety of parameters specifying the vessel dimensions, the fluid type(s), and the flow parameters of the liquid level control loop. The optimizer also receives a selection of various valve and actuator options and determines a variety of available configurations based on the selected options. The optimizer simulates each of the available configurations under the conditions specified by the parameters, and determines control loop characteristics and/or properties based on the simulations. The optimizer may display and/or rank the various configurations to assist a user in selecting a configuration that best meets the requirements of the control loop.

19 Claims, 12 Drawing Sheets

(56) References Cited

U.S. PATENT DOCUMENTS

| | | | |
|---|---|---|---|
| 2006/0253204 A1* | 11/2006 | Papanikolaou | G06F 17/5045 700/1 |
| 2007/0005152 A1* | 1/2007 | Karr | G06F 1/28 700/22 |
| 2007/0132779 A1* | 6/2007 | Gilbert | G05B 19/0426 345/619 |
| 2007/0163877 A1* | 7/2007 | Brown | C25B 1/04 204/297.02 |
| 2008/0183310 A1 | 7/2008 | Dykstra | |
| 2009/0168908 A1* | 7/2009 | Lee | H04L 25/0212 375/260 |
| 2010/0006599 A1* | 1/2010 | Cebulski | G01F 1/00 222/71 |
| 2011/0080893 A1* | 4/2011 | Fong | H04W 36/0055 370/331 |
| 2012/0150517 A1* | 6/2012 | Ray | G06F 17/5009 703/10 |

OTHER PUBLICATIONS

International Preliminary Report on Patentability issued in PCT Patent Application No. PCT/US2014/058303 dated Apr. 14, 2016.
International Search Report issued in PCT/US2014/0558303 dated Jan. 20, 2015.
Written Opinion issued in PCT/US2014/058303 dated Jan. 20, 2015.
Office Action issued in Chinese Patent Application No. 201410514702.1 dated Jan. 10, 2018.
Decision of Rejection issued in Chinese Patent Application No. 201410514702.1, dated Feb. 11, 2019.
Notification of the Second Office Action issued in Chinese Patent Application No. 201410514702.1, dated Aug. 1, 2018.
Office Action issued in Russian Patent Application No. 2016114726 dated Aug. 21, 2018.

* cited by examiner

LIQUID LEVEL CONTROL LOOP OPTIMIZER

RELATED APPLICATION

This is a regular filed application that claims priority to and the benefit of U.S. Patent Application No. 61/884,563, filed on Sep. 30, 2013, entitled "Liquid Level Control Loop Optimizer," the entire disclosure of which is incorporated by reference herein, in its entirety, for all purposes.

FIELD OF THE DISCLOSURE

The present disclosure is directed to liquid level control loops in process plants and, more particularly, to optimization of liquid level control loops and electric liquid level control loops.

BACKGROUND

Some industrial processes, such as those in the petroleum industry, employ liquid holding vessels for various purposes, including for the separation of liquids having different specific gravities. Such vessels generally have a known or expected inflow value, and need to be periodically drained, or "dumped", in order to maintain the liquid level in the vessel at or around a desired level. For much of their history, process control systems employed pneumatic level controllers and pneumatically actuated "dump" valves (or "drain" valves) for this purpose. Pneumatic control typically has very low latency, as the pressures employed in such control are capable of actuating a valve very quickly, for example, in as a few a hundred milliseconds.

Over time, process control systems have moved from pneumatic to electric control. In many instances, dump valves are electrically actuated and/or employ electric level controllers. Electric level controllers and, especially, electric actuators introduce latencies between the instruction to open or close a valve and the response of the actuator. For example, electric level controllers provide electric control signals which, if coupled to a pneumatic actuator, must be converted into a pneumatic signal to control a valve, and if coupled to an electric actuator must be acted upon by an electric motor that cannot actuate a valve as quickly as a pneumatic force. Accordingly, there is a delay between the time at which a sensor signal indicates to the level controller that a valve must be actuated, and the time at which the actuator responds to a command from the level controller.

SUMMARY

In an embodiment, a method of optimizing a liquid level control loop includes receiving a selection of a vessel type, receiving one or more vessel parameters corresponding to the selected vessel type, receiving one or more flow parameters, receiving a target differential gap parameter, and receiving an indication of one or more potential valve and actuator configurations. The method also includes simulating each of the possible valve and actuator configurations using the received vessel type selection, vessel parameters, and flow parameters, and displaying the results of the simulations. In some embodiments, the method includes eliminating from the possible valve and actuator configurations any ones of the configurations that are determined by the simulation to be unusable given the received vessel type selection, vessel parameters, and flow parameters. In some embodiments, the method includes ranking each of the configurations according to the results of the respective simulations.

DETAILED DESCRIPTION

The present disclosure is directed to a liquid level control loop optimizer. The use of electric components (e.g., controllers and valve actuators) in liquid level control loops has introduced non-negligible control latencies influenced by actuator latencies, field power supply voltage influences, level rise and fall rate dependencies, and liquid inflow characteristics not previously considered in configuring typical pneumatic level control loops. The presently disclosed liquid level control loop optimizer simulates the operation of a liquid level control loop implementing electric components according to user-specified requirements, and provides detailed information about the operation of one or more potential configurations, including information about whether the configuration will meet the user-specified requirements, and how each usable configuration will perform.

Figure 1:
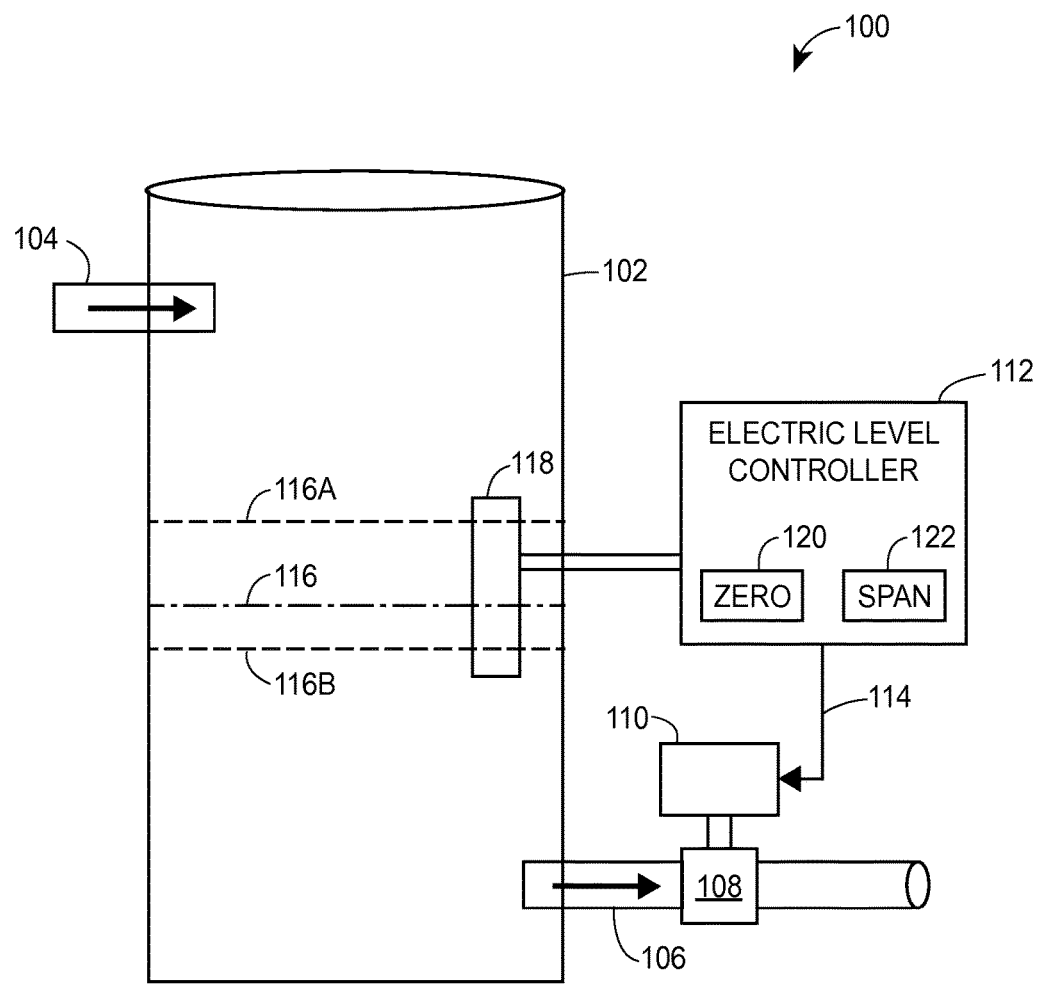
FIG. 1 is a diagram of a portion of a process plant including a liquid level control loop.

FIG. 1 is a diagram of a portion 100 of a process plant including a vessel 102. The vessel 102 is depicted in FIG. 1 as a simple vessel, but may be any known type of vessel (e.g., for holding liquids, performing phase separation, etc.) in which a liquid level is maintained at or near a certain point according to the process requirements. The vessel 102 has an inflow pipe 104 via which liquid(s) and/or gas(es) enter the vessel 102. The inflow pipe 104 may be coupled, for example, to a pipeline delivering to a production platform oil from a seabed well. Generally, the inflow pipe 104 can be coupled to any system in which liquid is delivered into a vessel (for fermentation, phase separation, or any other activity) and periodically emptied from the vessel. The vessel 102 also has an outflow pipe 106 for draining fluid from the vessel 102, which pipe 106 may be coupled to any further process elements as desired/required. While the inflow pipe 104 and the outflow pipe 106 are depicted in FIG. 1 as at the top and bottom of the vessel 102, respectively, FIG. 1 depicts only one possible configuration. Both the inflow pipe 104 and the outflow pipe 106 may be coupled to the vessel 102 according the particular type of vessel 102 and the desired function of the vessel 102. For example, an outflow pipe 106 may be coupled to the vessel 102 at the bottom of the vessel 102 to drain fluid at the bottom of the vessel 102 (e.g., fluid with a highest specific gravity), toward the top of the vessel 102 to drain fluid toward the top of the vessel 102 (e.g., fluid with a lowest specific gravity), somewhere in the middle of the vessel 102 to drain fluid at an interface between two fluids, in bucket within the vessel 102, etc.

Flow from the vessel 102, via the pipe 106, is controlled by a dump valve 108 actuated by an actuator 110. The dump valve 108 may be any type of valve appropriate for the fluids involved in the process and, in particular, may be a valve, such as a Fisher D3 or D4 Control Valve offered by Emerson Process Management, that is configured to operate with an electric valve actuator, such as the Fisher easy-Drive Electric Actuator also offered by Emerson Process Management. In one embodiment, the dump valve 108 may be a sliding stem valve, while in another embodiment, the dump valve 108 may be a rotary valve. The dump valve 108 may be configured or configurable for the size of the valve and/or for the size of the valve port. In embodiments, the valve model, valve size, and valve port size are selected and/or configured according to the requirements of the application. For example, larger port sizes may be selected where the rate at which fluid is drained through the dump valve 108 is higher.

A level controller 112 provides control signals to the actuator 110 via a connection 114. Though the level controller 112 may be any type of level controller, in one embodiment, the level controller 112 is an electric level controller, and the connection 114 is an electric coupling connection through which the level controller 112 provides electric control signals to the actuator 110. In embodiments, the level controller 112 is selected and/or configured according to the voltage(s) required to drive the particular actuator 110 selected. In particular embodiments, the level controller 112 is a differential gap on-off controller, that operates the actuator 110 and, in turn, the valve 108, to maintain a fluid level 116 in the vessel 102 between a maximum level 116A and a minimum level 116B. The distance between the maximum level 116A and the minimum level 116B is called the differential gap (DG). A sensor 118, which may be any appropriate type of sensor, such as a displacement sensor, provides information about the fluid level to the level controller 112.

The level controller 112 may include a zero adjustment mechanism 120 that allows adjustment of a mid-point level within the vessel 102. The level controller 112 may also include a span adjustment mechanism 122 that allows tuning and/or adjustment of the differential gap.

As will be understood in view of the description above, the configuration of the valve 108, the actuator 110, and the controller 112 will cooperate with the desired parameters of the liquid level control loop (e.g., differential gap size, rate of flow into the vessel 102, etc.) to determine various operational properties of the liquid level control loop. Such properties include, without limitation, the volume per dump (also referred to as the dump volume), the number of dump cycles per day, the dump time (i.e., the time that the valve is open to achieve the dump volume), the fill time (i.e., the time between the closing of the valve in one dump cycle and the opening of the valve in the next dump cycle), the cycle time (i.e., the time between the start of consecutive dump cycles), the power required to operate the valve, and the duty cycle of the valve. For example, larger valve port sizes will result in reduced dump times for a given volume (or alternately greater dump volume per unit time) and reduced duty cycle, potentially resulting in decreased valve wear. Narrower DG settings will result in more frequent dump cycles, which may increase valve wear. Other relationships between the operational properties, and the configuration parameters will be readily appreciated in view of the present disclosure.

Figure 2:
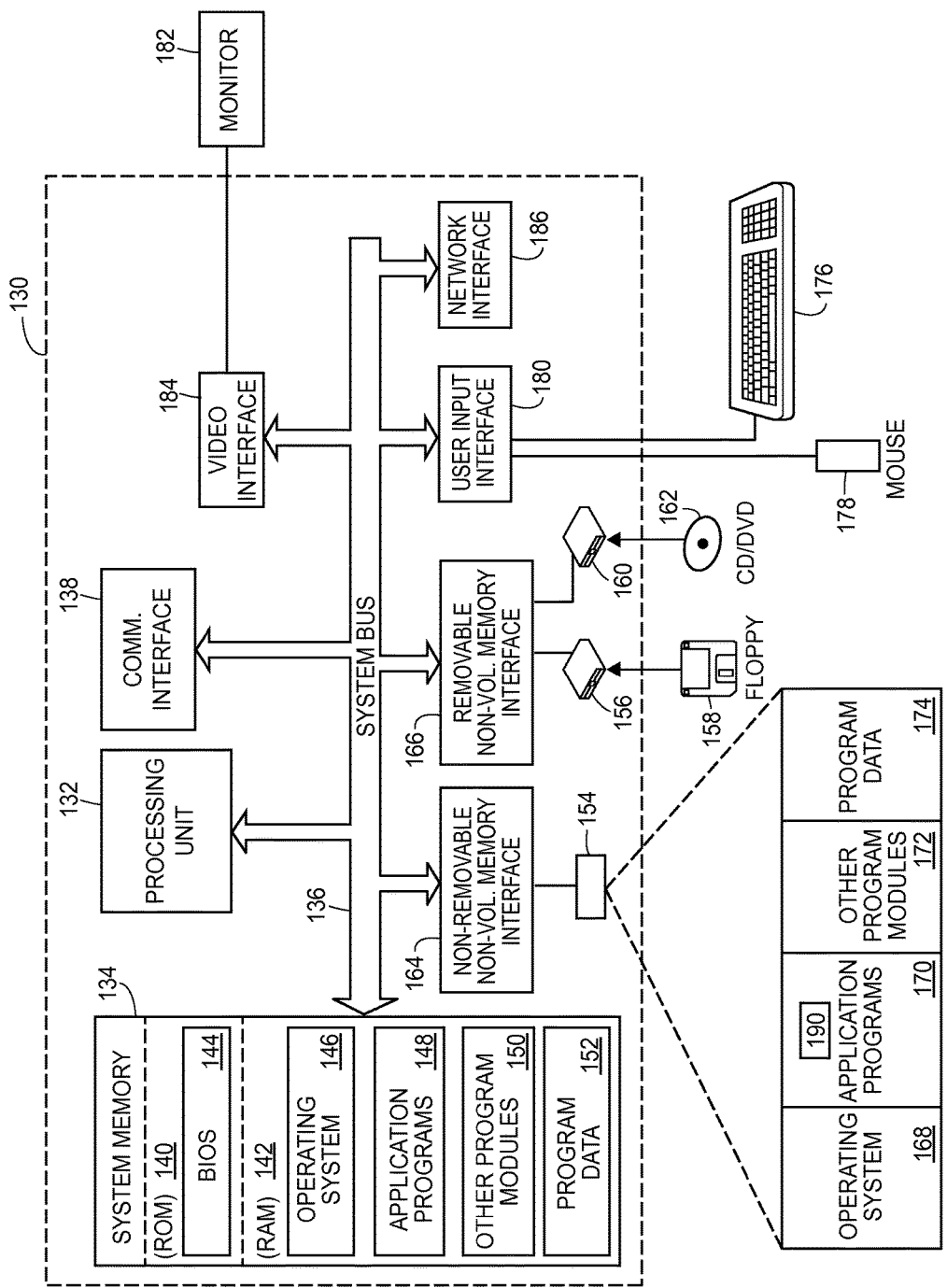
FIG. 2 is a block diagram of a computer system that may implement a liquid level control loop optimization method.

FIG. 2 illustrates a logical view of a computing device in the form of a computer 130 that may be used for liquid level control loop optimization. For the sake of illustration, the computer 130 is used to illustrate the principles of the instant disclosure. However, such principles apply equally to other electronic devices having sufficient computing power, including, but not limited to, smartphones, personal digital assistants, tablet computers, and laptop computers, to name a couple. Components of the computer 130 may include, but are not limited to, a processing unit 132, a system memory 134, and a system bus 136 that couples various system components including the system memory 134 to the processing unit 132. The system bus 136 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, front side bus, and Hypertransport™ bus, a variable width bus using a packet data protocol.

The computer 130 may include one or more serial, parallel, or other communication interfaces 138, such as Universal Serial Bus (USB) interfaces, IEEE-1394 (FireWire) interfaces, RS-232 interfaces, RS-423 interfaces, RS-485 interfaces, IEEE-488 (HPIB or GPIB) interfaces, etc.

The computer 130 typically includes a variety of computer readable storage media (i.e., non-transitory media). Computer readable storage media can be any available storage media that can be accessed by computer 130, and includes both volatile and nonvolatile media, removable and non-removable media. By way of example, and not limitation, computer readable storage media may comprise volatile and nonvolatile, removable and non-removable media implemented in any method or technology for storage of information such as computer-readable instructions, data structures, program modules or other data. Computer readable storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 130.

The system memory 134 includes computer storage media in the form of volatile and/or nonvolatile memory such as read only memory (ROM) 140 and random access memory (RAM) 142. A basic input/output system 144 (BIOS), containing the basic routines that help to transfer information between elements within computer 130, such as during start-up, is typically stored in ROM 140. RAM 142 typically contains data and/or program modules that are immediately accessible to and/or presently being operated on by processing unit 132. By way of example, and not limitation, FIG. 2 illustrates an operating system 146, application programs 148 (such as one or more modules or routines embodying part or all of the methods described herein), other program modules or routines 150, and program data 152, which may include data resident within, for use by, and/or created by the application programs 148.

The computer 130 may also include other removable/non-removable, volatile/nonvolatile computer storage media. By way of example only, FIG. 2 illustrates a hard disk drive 154 that reads from or writes to non-removable, nonvolatile magnetic media, a magnetic disk drive 156 that reads from or writes to a removable, nonvolatile magnetic disk 158, and an optical disk drive 160 that reads from or writes to a removable, nonvolatile optical disk 162 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 154 is typically connected to the system bus 136 through a non-removable memory interface such as interface 164, and the magnetic disk drive 156 and the optical disk drive 160 are typically connected to the system bus 136 by a removable memory interface, such as an interface 166.

The drives and their associated computer storage media discussed above and illustrated in FIG. 2, provide storage of computer readable instructions, data structures, program modules, and other data for the computer 130. In FIG. 2, for example, the hard disk drive 154 is illustrated as storing operating system 168, application programs 170, other program modules 172, and program data 174. Note that these components can either be the same as or different from the operating system 146, the application programs 148, the other program modules 150, and the program data 152. The operating system 168, the application programs 170, the other program modules 172, and the program data 174 are given different references here to illustrate that, at a minimum, they are different copies. A user may enter commands and information into the computer 130 through input devices such as a keyboard 176 and a pointing device 178, commonly referred to as a mouse, trackball, or touch pad. Other input devices (not shown) may include a touch display, a microphone, a joystick, a game pad, a satellite dish, a scanner, a digital camera, or the like. These and other input devices are often connected to the processing unit 132 via a user input interface 180 that is coupled to the system bus 136, but may be connected by other interface and bus structures, such as a parallel port, game port or a universal serial bus (USB). A monitor 182 (which may be the aforementioned touch display) or other type of display device is also connected to the system bus 136 via an interface, such as a video interface 184.

The computer 130 may operate in a networked environment using logical connections to one or more remote computers (not depicted) over a network interface 186, such as broadband Ethernet connection, an IEEE 802.11 wireless connection, a Bluetooth connection, or other known network connection. The computer 130 may communicate via the network interface 186 with one or more other computers executing one or more software modules embodying a portion of the methods described herein, for example to split the processing requirements for real-time data manipulation among multiple computers, or to send data to or receive data from a server for the purpose of receiving updated modeling data, transmitting parameters for remote processing, receiving remotely-generated results, and the like.

Figure 3:
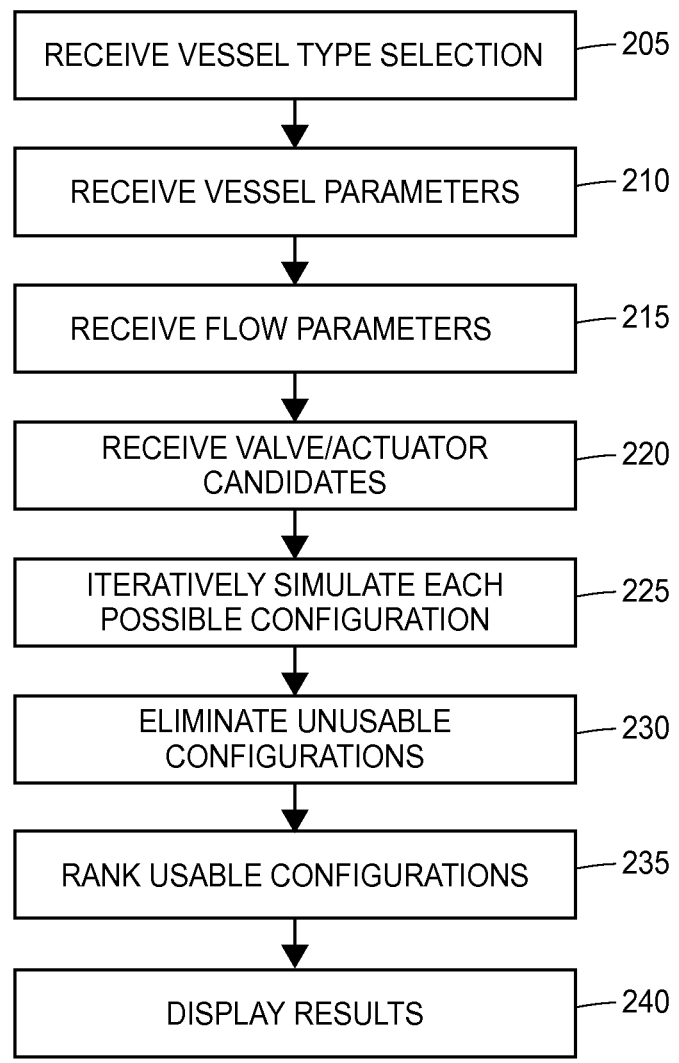
FIG. 3 is a flow chart depicting an example method for liquid level control loop optimization.

The application programs 170 stored on the computer-readable storage media of the computer 130 and executed by the processing unit 134 include a program 190 for optimizing a liquid level control loop, in an embodiment. The program 190 may be constructed as one routine or module, or as a collection of routines or modules. In any event, the program 190 generally executes a method 200, depicted generally as a flow chart in FIG. 3. The method 200 includes receiving a vessel type selection (block 205). The vessel type selection may be received, in embodiments, via a user interface presented to a user on a display (e.g., the monitor 182). Various vessel types available to be selected may be depicted on the display sequentially, or may be listed according to model number, etc. The vessel type, as described above, can be any type of a vessel, including horizontal vessels, vertical vessels, phase separation vessels (two phase, three phase, etc.), vessels having internal buckets, etc. As will be understood, some vessel configurations may include multiple drain valves. Accordingly, the selection of a vessel type may also include selection according to which of a plurality of drain valves in a particular vessel configuration is being configured. The types of vessels from which a selection may be made may be stored as part of the application program 190, or as part of the program data 174 associated with the application program 190.

Once a vessel type selection has been received, vessel parameters for the selected vessel type may be received (block 210). The vessel parameters (and, in fact, all parameters described in the following paragraphs) associated with a particular vessel type may be retrieved from memory (e.g., from the program data 174) and may be presented to the user in any one of a variety of control-types (text boxes, scroll bars, drop-down boxes, etc.) that allow the user to enter the requested parameter data. The parameter data may include, by way of example and not limitation, vessel diameter, vessel length, vessel height, weird heights, bucket heights, and the like. The parameter data may be any data required to calculate or estimate the level of a fluid in the vessel or a level of a phase interface in the vessel. Various vessel types may require or omit different vessel parameters. For example, a simple vertical vessel may require only a diameter, as the diameter does not vary with the height, while a simple horizontal vessel may require a height, a length, and a diameter. The vessel parameters may also include: parameters related to the displacer (the sensor) 118, such as the orientation and size of the displacer; an application for the vessel, and a user of the vessel and/or of the program 190.

The method 200 also includes receiving flow and/or liquid parameters (block 215). The flow and/or liquid parameters may include information about the specific gravity of the fluid(s) in the vessel, the vapor pressure(s) of the fluid(s), the critical pressure(s) of the fluid(s), and the type(s) of fluid(s). In some embodiments, the selection of a fluid type may result in population of one or more of the other fluid properties, such as the vapor pressure and/or critical pressure of the fluid. The flow and/or liquid parameters may also include a target differential gap (e.g., 3 inches, 4 inches, 7 inches, etc.), and the amount of fluid flowing into the vessel per unit time (e.g., 200 bbl/day, 1000 gal/hour, etc.). Upstream and downstream pressures may also be included in the flow and/or liquid parameters received.

Valve and/or actuator candidates are also received in the method 200 (block 220). A user may be presented (e.g., in the form of multi-select lists, checkboxes, etc.) a variety of valve types, valve sizes, port sizes, actuator voltages, and/or other options. The user may select at least one option from each of the candidate properties. The selection may be made by the user, for example, according to the types of devices available in existing parts supplies (e.g., the user already owns one or more of the configurations of valves and/or actuators), based on the availability of certain voltages at a particular site, based on space considerations, based on the purchase and/or maintenance costs of particular valve and/or actuator configurations, etc.

In any event, once the selection of the valve/actuator candidates has been received (at the block 220), the method includes iteratively simulating each possible combination based on the received selection of valve/actuator candidates (block 225). In an instance where the user selected valve type A and valve type B, selected valve size 1 and valve size 2, and selected port size X, port size Y, and port size Z, the iterative simulation of each configuration may include 12 simulations, assuming that each port size, valve size, and valve type combination were valid (e.g., A+1+X, A+1+Y, A+1+Z, A+2+X, . . . , B+1+X, . . . , B+2+X, . . . , B+2+Z). If one or more of the selected configurations is not available (e.g., if valve type A is only available with valve size 1), then fewer simulations would result from the iterative simulation of the configurations. The iterative simulation of configurations based upon received parameters may be executed as a results of receipt of a user input indicating that optimization should be commenced.

The simulation routines or modules executed to perform the simulations may employ a variety of data including, but not limited to, data gleaned from device operating specifications; empirical data derived from testing various device configurations under various circumstances, both static and dynamic; and first principles data such as known relationships between parameters. In some embodiments, the different types of data may be combined to create models of each available valve/actuator configuration, which models may be used to simulate each configuration according to the vessel, liquid, and flow parameters received from the user. The data and/or models used by the simulation routines or modules may be stored as data within the application 190 (e.g., among the application programs 170), or as program data 174.

The simulation routines or modules include or access (e.g., from the models) data related to the latencies in electric level controllers, electric valve actuators, and other components in the liquid level control loop, as well as data related to actuator speeds, gain settings, and overshoots. Additionally, the routines or modules may access data related to the influence of different supply voltages, rise and fall rate dependencies, and inflow characteristics not considered for pneumatic level control loops. As a result, for a given configuration of valve, actuator, and controller, and for a given vessel, liquid, and set of flow characteristics, an accurate set of loop parameters may be derived from the simulation.

In certain configurations, empirical data collected for the purpose of accounting for latency revealed an unexpected and previously unknown effect of rate of liquid level rise/fall on the performance of level loop control. Specifically, the speed of liquid level rise and fall may affect overshoot associated with the liquid level control loop. That is, greater rise and fall rates will cause greater overshoot of the liquid level beyond the established differential gap. For example, a very fast rate of liquid level rise can cause the liquid level to overshoot the upper end of the target DG, or a very fast dump rate can cause the liquid level to overshoot the lower end of target DG. The amount of overshoot is related to the rise/fall speed. Data revealed that slower level rises and falls do not exhibit this effect. This effect is not predicted based on known performance characteristics (valve, actuator, or controller characteristics) of level control loops. Having discovered this effect, the disclosed method 200 is able to account for the effect, thereby further increasing the accuracy with which a liquid level control loop may be implemented.

In embodiments, the method 200 may include eliminating unusable configurations based on the results of the simulations (block 230). For instance, it is possible that, for a given set of received parameters, a particular valve configuration will be unusable. As one example, a valve/actuator configuration may be unable to dump enough fluid to maintain the differential gap value received at block 215. As another example, a valve/actuator configuration may be untenable because a target span setting is too low or too high to provide sufficient adjustability/tuning in the field. In other embodiments the unusable configurations may be identified, but not eliminated.

The usable configurations (or all of the configurations) may also be ranked, in some embodiments (block 235). The configurations may be ranked according to any one of a variety of the properties output by the simulation and, in particular, in an embodiment, may be ranked according to the target span setting for the loop level controller. A loop level controller has span settings ranging from 1 to 6, in an embodiment. Each configuration may be ranked according to the target span setting for the configuration, such that the maximum amount of adjustability/tuning is available. That is, for the loop level controller with span settings ranging from 1 to 6, a target span setting of 3 may receive a highest score, while a target span setting of 1 or 6 may receive lowest scores. In embodiments, the score as a function of target span setting may be parabolic, having a maximum value at 3.

The resulting loop properties for each valve/actuator configuration may be displayed (block 240). The properties may be displayed in any suitable manner, but in one configuration, are displayed as a list having one row for each configuration, and sortable based upon any of the loop properties. Some of the loop properties, such as the dump cycle characteristics may be displayed as a graph. In an embodiment, a graph may depict the fluid level and the valve travel as a function of time. The time divisions ("ticks") may correspond to the discrete simulation points, which, in some embodiments, are variable according to the dump cycle time, the fill time, the dump time, and/or the valve travel, such that the tick time is selected to simulate the dump cycle with sufficient accuracy to capture relevant information. The graph may be displayed for a highlighted or selected one of the configurations.

The method 200 may also include, in some embodiments, the optional performance of a slug calculation. As is known, in multiphase pipelines, a flow pattern known as a slug occurs. A slug is characterized by irregular patterns of flow, and by surges (slugs) that can occur when liquid collects at a low point in a pipeline and accumulates sufficiently to block the flow of gas in the pipeline. The accumulated liquid is eventually expelled when the pressure of the blocked gas pushes the liquid out of the pipeline (e.g., into the vessel 102) causing a surge. In embodiments that include a slug calculation, the method 200 may include receiving, for a selected one of the configuration, a slug factor, simulating the operation of the configuration under the conditions of the slug factor, and determining, for the slug factor, whether the selected configuration will adequately handle the surge of fluid into the vessel 102. The method 200 may also include displaying graphical analysis of the performance of the configuration for the slug factor.

In some embodiments, the method 200 may include configuring a liquid level control loop according to the optimizer output. In still additional embodiments, the method may include some or all of the steps of: receiving a selection of a configuration to use, receiving a request to order the components of the selected configuration, creating a bill of materials or a list of components to order, sending to a server a request for the components, and/or confirming an order for the components associated with the selected configuration.

Of course, it should be understood that the method 200 need not include all of the steps described and need not include the steps in the same order. For example, the only order(s) that should be imputed to the method 200 are those which are required by the logical order. The receipt of the vessel selection and the various parameters and configuration candidates must all be completed before the iterative simulation, for instance.

Figure 4:
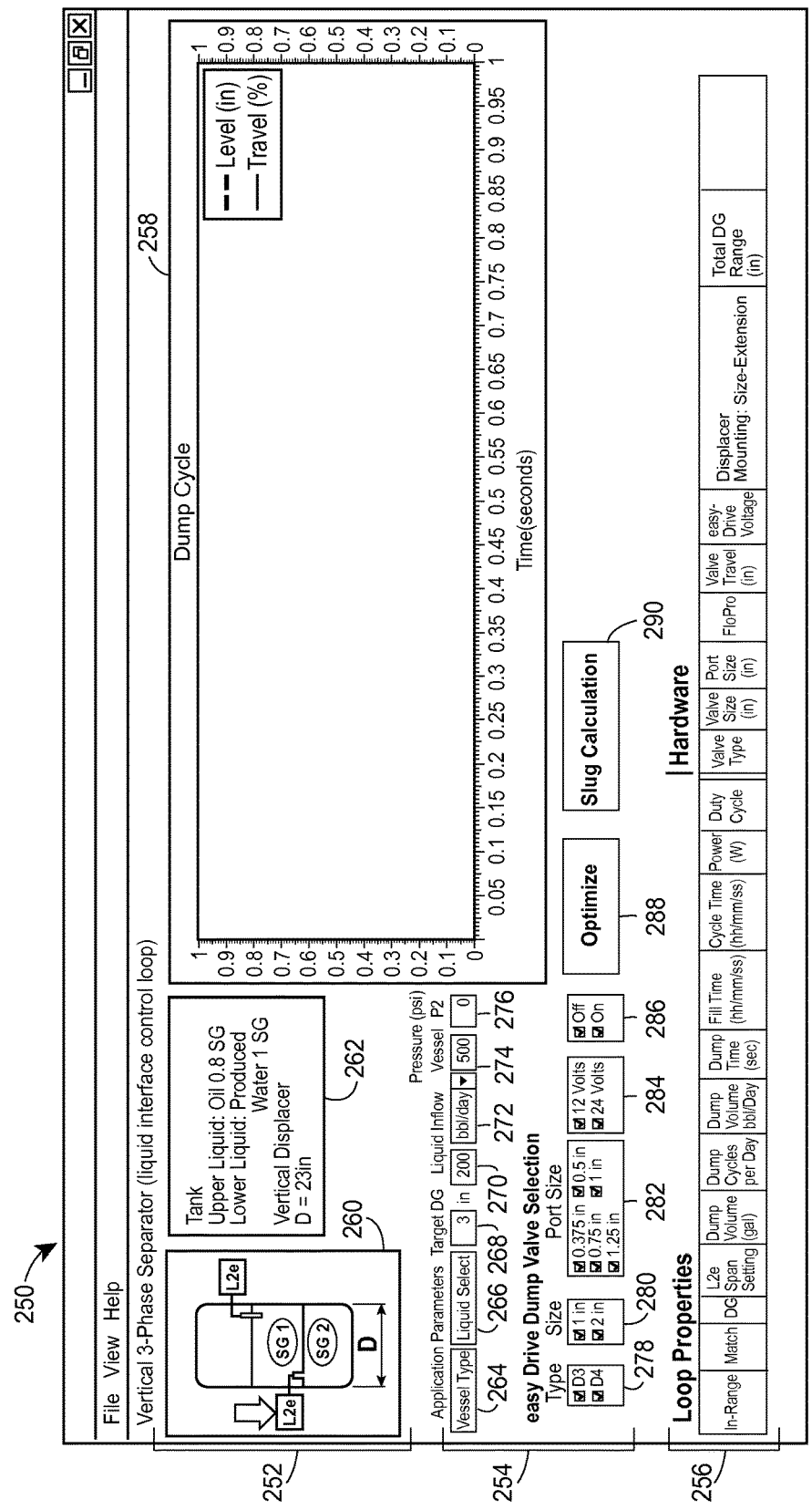
FIG. 4 is an example user interface for implementing a liquid level control loop optimization method.
Figure 7:
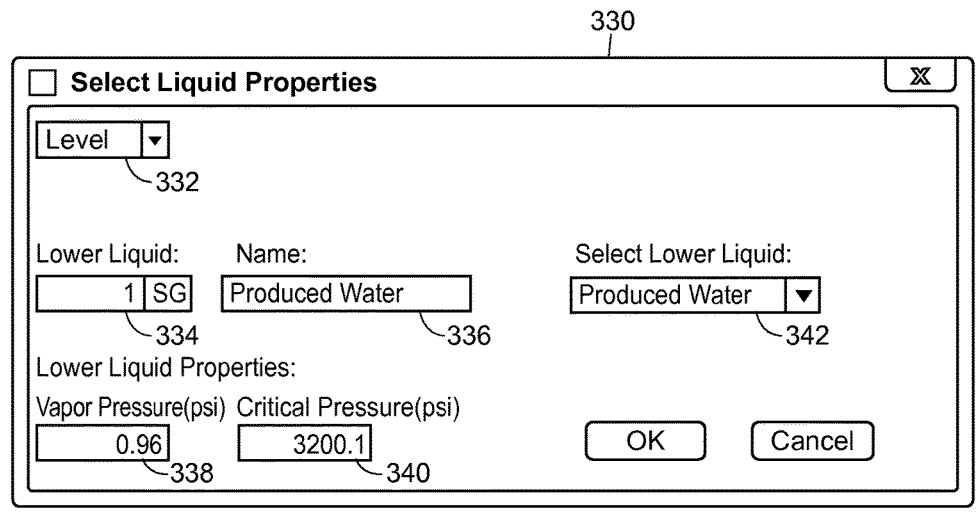
FIG. 7 is an example dialog box associated with the user interface of FIG. 4 for facilitating entry of liquid properties for the vessel configuration of FIG. 5.

An example embodiment of the a user interface 250 associated with the application 190 is depicted in FIG. 4. The example user interface 250 includes four primary information areas: a vessel and liquid information area 252; a flow and configuration area 254, a simulation result area 256, and a graph area 258. The vessel and liquid information area 252 includes an illustration 260 of the selected vessel and its relevant dimensions, as well as an information block 262 noting the vessel dimensions, the type of displacer, and the liquid types and specific gravities specified. The flow and configuration area 254 includes a button 264 for activating a vessel type selection dialog box (see, e.g., FIG. 3) and a button 266 for activating a liquid information dialog box (see, e.g., FIG. 7). The area 254 also includes a text box 268 for receiving an specified target differential gap, a text box 270 for receiving a specified liquid inflow volume, a pull-down menu 272 for selecting the volume/time units, and text boxes 274 and 276 for receiving, respectively, specified pressures.

The area 254 also includes valve and actuator configuration selection controls, as well. A group 278 of check-boxes allows a user to select valve types; a group 280 of check-boxes allows the user to select valve sizes; a group 282 of check-boxes allows the user to select port sizes; a group 284 of check-boxes allows the user to select actuator drive voltages; and a group 286 of check-boxes allows the user to select additional options. A button 288 activates the optimization/simulation procedures, and a button 290 activates an optional slug calculation.

Figure 5:
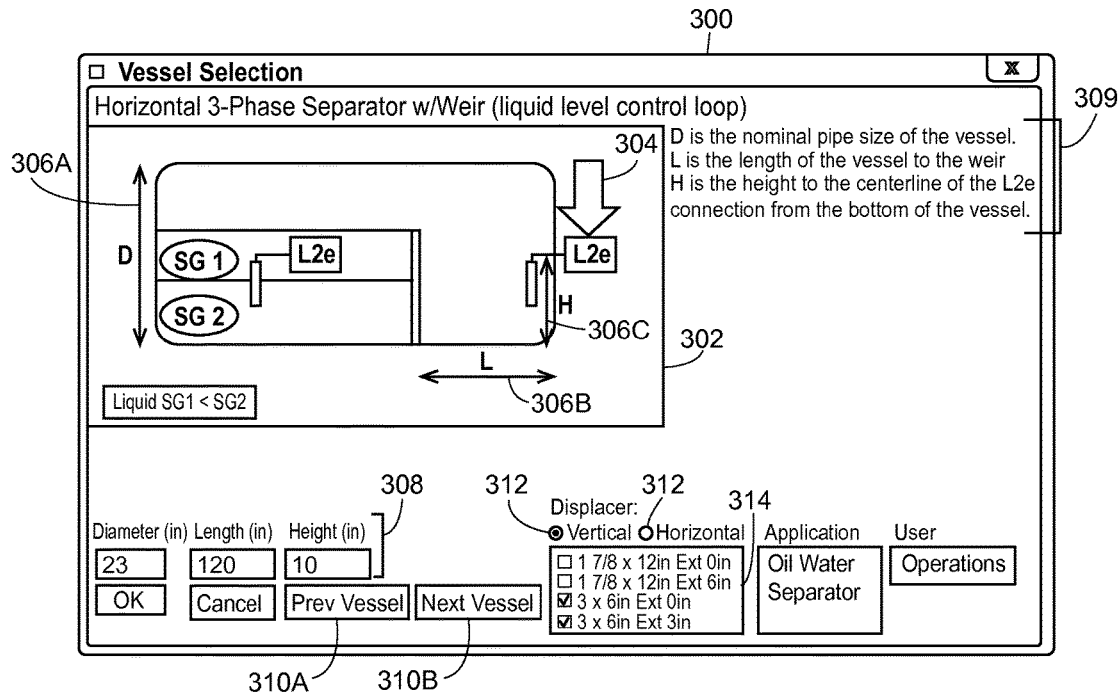
FIG. 5 is an example dialog box associated with the user interface of FIG. 4 and depicting a vessel configuration.

FIG. 5 depicts an example dialog box 300 that may be displayed when a user selects the button 264. The dialog box 300 includes an illustration 302 of the selected vessel configuration. In instances where the selected vessel configuration includes more than one drain valve, an arrow 304 in the illustration 302 may make clear which valve is the subject of the present control loop optimization. The illustration 302 may indicate (see 306A, 306B, 306C) the measurements that correspond to a set 308 of requested dimensions, and a text box 309 may describe each of the requested dimensions. Buttons 310A and 310B allow the user to navigate to previous and next vessel configurations, respectively. In the example dialog box 300, radio buttons 312 facilitate the selection of a displacer orientation, and a set 314 of check-boxes allows the user to select displacer configurations to include in the simulation.

Figure 6:
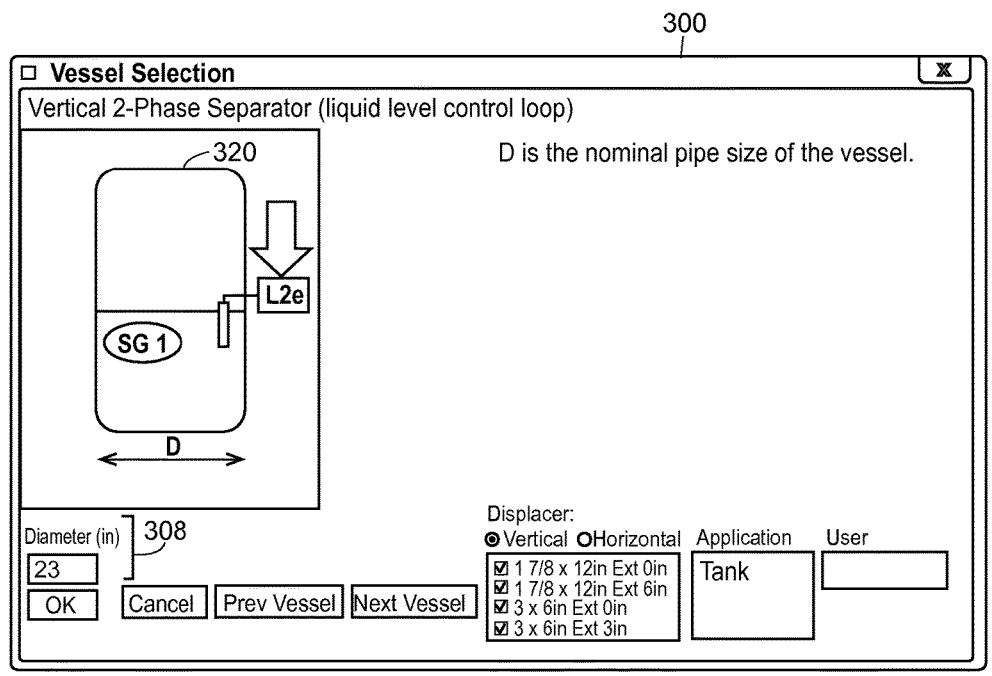
FIG. 6 is the example dialog box of FIG. 5 depicting a different vessel configuration.

Turning to FIG. 6, the example dialog box 300 is depicted showing an alternate vessel configuration, such as if the user had activated one of the buttons 310A or 310B. Note that the illustration 302 depicts a vertically oriented vessel, and that the set 308 of requested dimensions includes only the vessel diameter. If the user activates the "OK" button on the dialog box 300 of FIG. 6, activation of the button 266 would cause the program 190 to display the dialog box 330 depicted in FIG. 7, to allow the user to select the properties of the liquid to be controlled in the liquid level control loop. A control 332 allows the user to select the type of liquid control performed (e.g., level control or phase interface control). In some embodiments, the control 332 will default according to the controller indicated by the arrow 304 in the vessel selection dialog 300. Because there is only a single liquid in the vessel depicted in FIG. 6, only a single control 334 is provided to allow the user to specify the specific gravity of the liquid. The user may provide a name for the liquid in a text box 336, and may specify the vapor pressure and critical pressure of the liquid in respective text boxes 338 and 340. In embodiments, a drop down menu 342 may allow a user to select common liquids, and may automatically populate the boxes 334-340 based upon the user selection.

Figure 8:
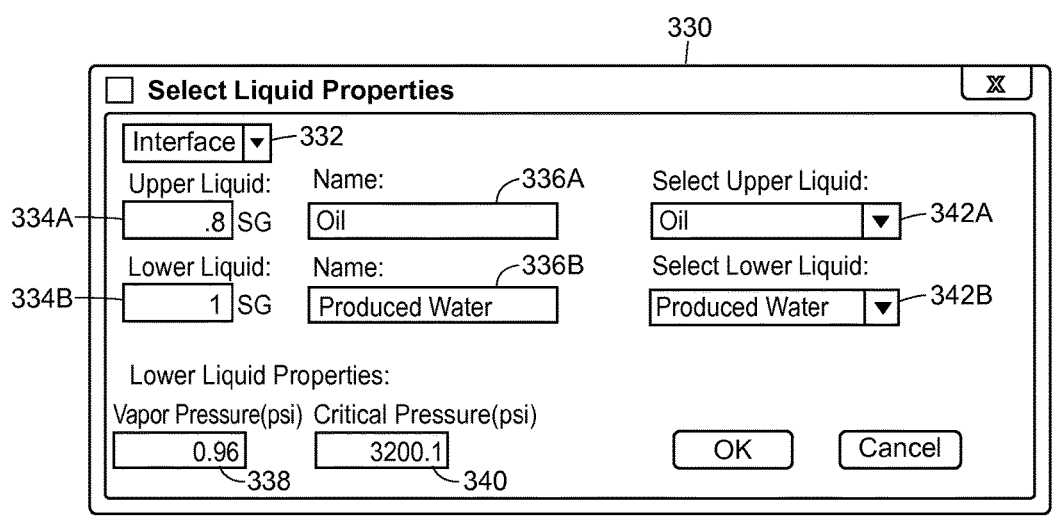
FIG. 8 is the example dialog box of FIG. 7 depicting liquid properties for another vessel configuration.

Returning to FIG. 4, the illustration 260 depicts yet another vessel configuration. In the vessel configuration depicted in FIG. 4, the vessel 102 depicted in FIG. 4 is a vertical 3-phase separator having two liquid phases and the control loop is operating on the interface between the two liquids. If the user activates the button 266, the dialog box 330 would appear as illustrated in FIG. 8. The control 332 illustrated in FIG. 8 shows that the controller indicated by the arrow 304 in the vessel selection dialog 300 indicates an interface. Each of the controls 334, 336, and 342 is duplicated for each of the liquids in the vessel. Controls 334A, 336A, and 342A relate to the upper liquid in the vessel 102, while controls 334B, 336B, and 342B relate to the lower liquid in the vessel 102.

Figure 9:
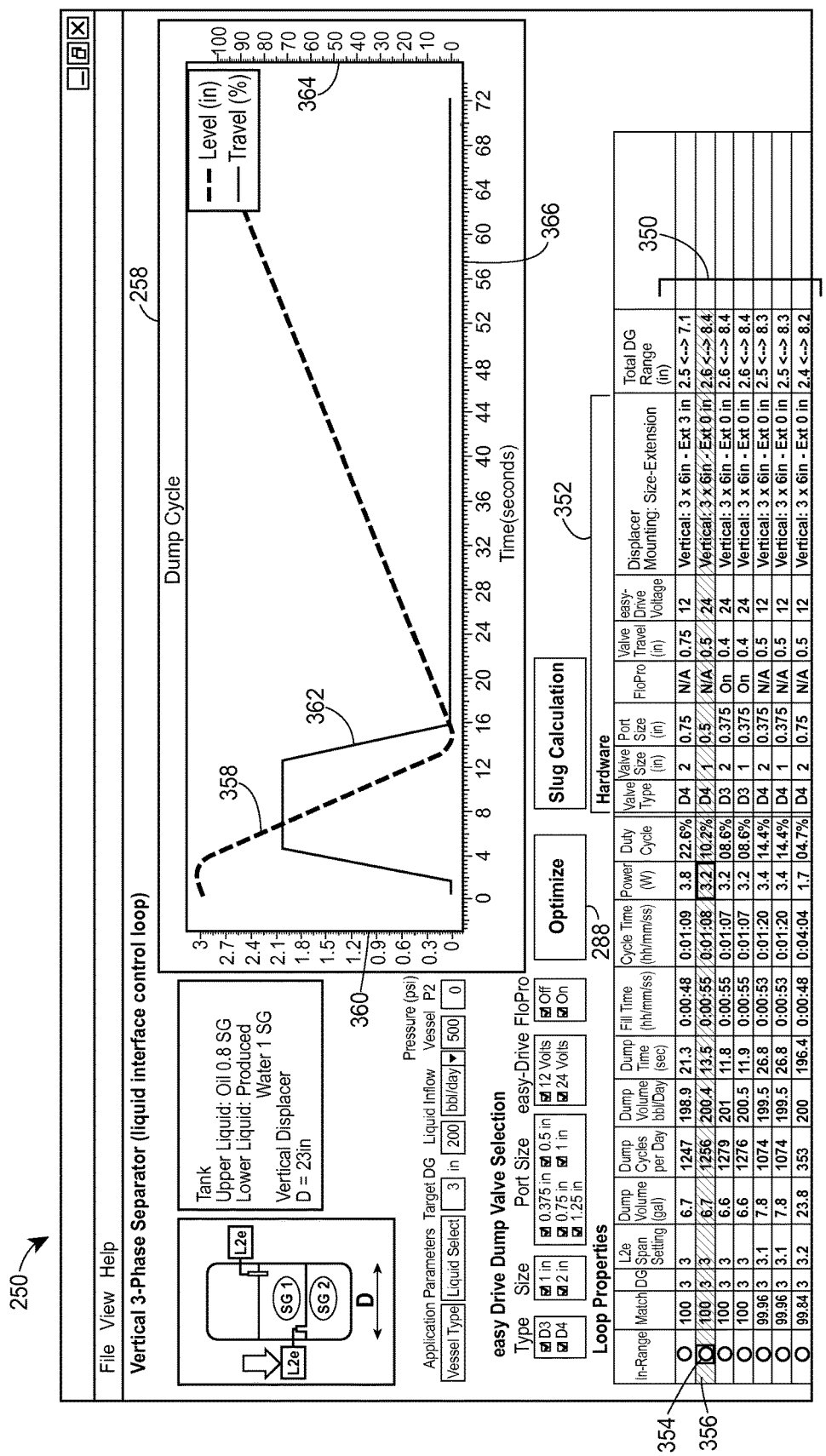
FIG. 9 depicts the example user interface of FIG. 4 displaying the results of simulated valve configurations with selected vessel, liquid, and flow parameters.

When the user activates the control 288 that causes the execution of the optimization/simulation procedures, the user interface 250 may display a list of simulation results 350 in the simulation result area 256, as depicted in FIG. 9. Each line in the list may represent a hardware configuration (which may also be displayed in the list, e.g., in a portion 352 of the result area 256), and may display the liquid level control loop properties determined via simulation of the corresponding hardware configuration. The list of simulation results 350 may include, for each result, an indicator 354 of whether the configuration meets the user-specified parameters. The indicator 354 may take the form of green, yellow, and red indicators, for example, or of different shapes (e.g., circles, triangles, and octagons), or of various other symbols indicating that positive, negative, and/or marginal results.

At the same time, the graph area 258 depicts a dump cycle of a selected configuration corresponding to a row 356 of the list of simulation results 350. In the graph area 258, a line 358 indicates the level of the fluid in the vessel 102 (corresponding to an axis 360) as a function of time (indicated along an axis 366). A line 362 indicates the valve travel of the valve 108 (corresponding to an axis 364) as a function of time (indicated along the axis 366). It will be appreciated that the line 362 shows that the valve travel increases steadily, but not as quickly as one might expect with a pneumatic valve. Instead, the valve 108 opens to about 65% travel over the course of approximately 3 seconds, maintains that position for approximately 8 seconds, and then closes over the course of approximately 3 seconds. The graph 258 reflects the consideration of the latency. Note that the valve starts to open at time 1 second—slightly before the liquid level reaches its maximum of 3 inches (the DG is set to 3 inches in this example). That is, the simulation understands that the valve must open slightly prior to the maximum in order to remain within the desired DG. Similarly, the valve begins to close at time 11 seconds—approximately 2 seconds before the liquid level reaches is minimum of 0 inches—in order to account for the relatively slow action of the electric actuator.

Figure 10:
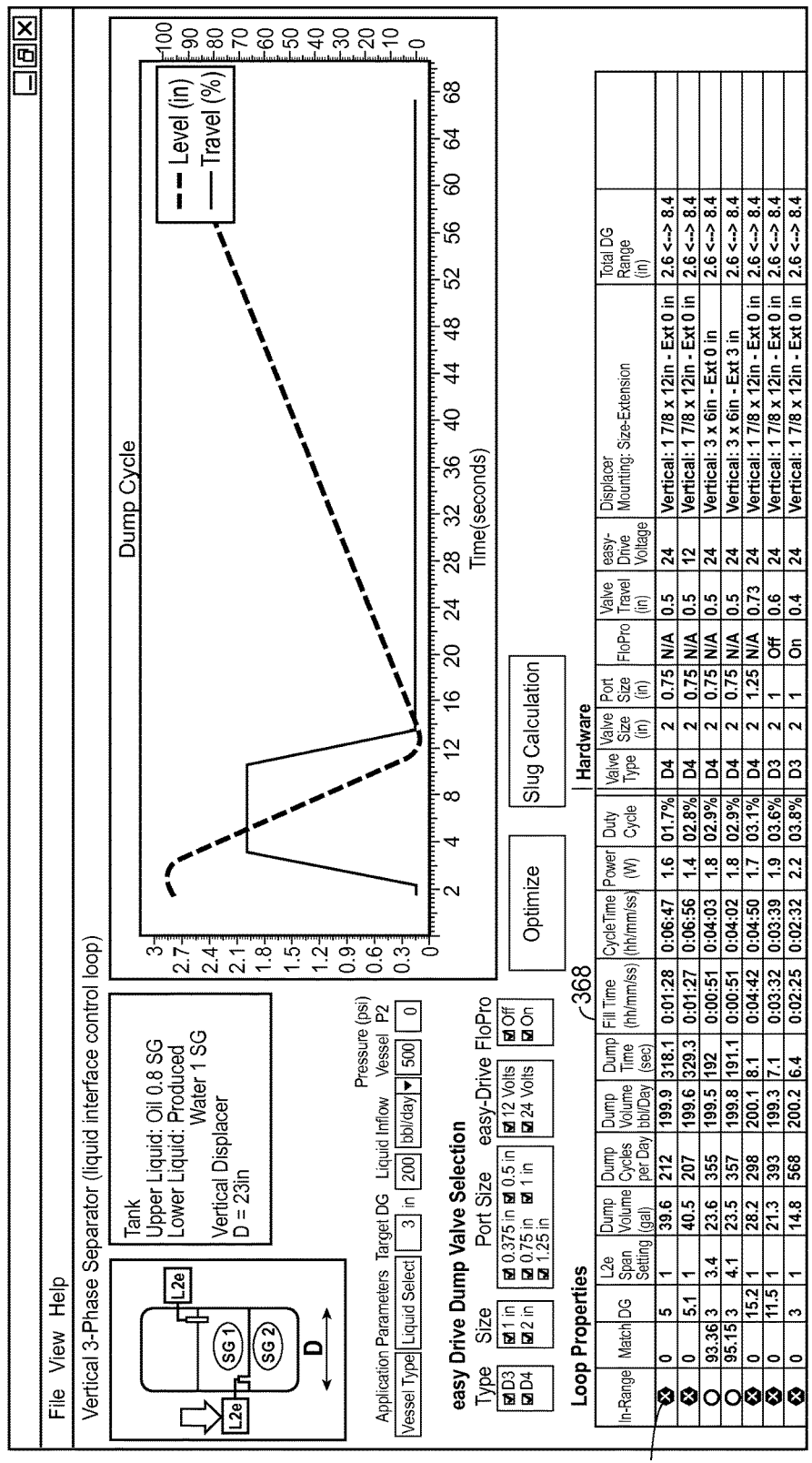
FIG. 10 depicts the example user interface of FIG. 4 displaying different results.

FIG. 10 depicts the same user interface screen 250, except that the list of simulation results 350 is sorted by a duty cycle column 368, resulting in the display of several unusable configurations, as indicated by the hexagonal "x" icons 354.

Figure 11:
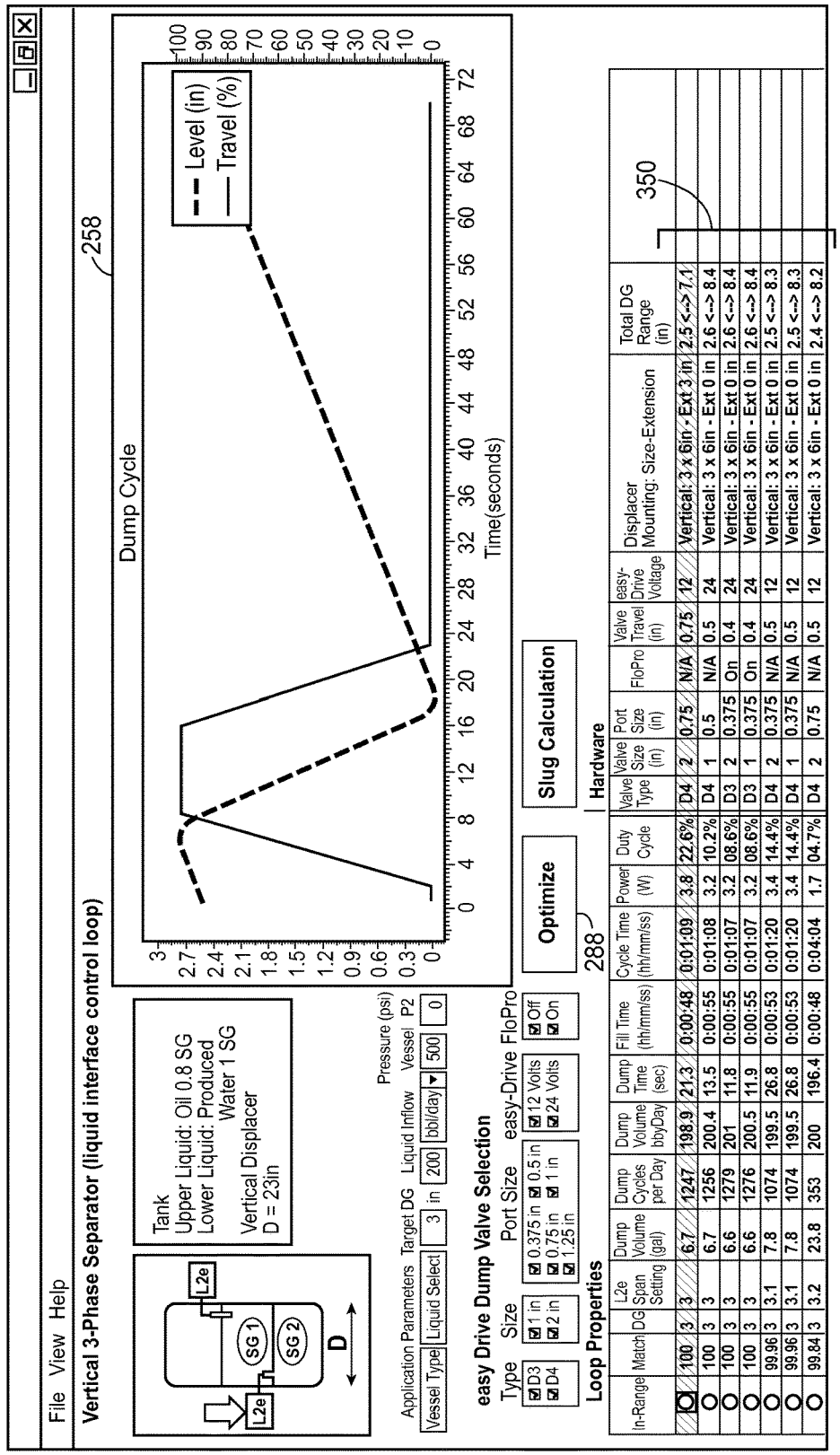
FIG. 11 depicts the example user interface of FIG. 4 displaying still other results.
Figure 12:
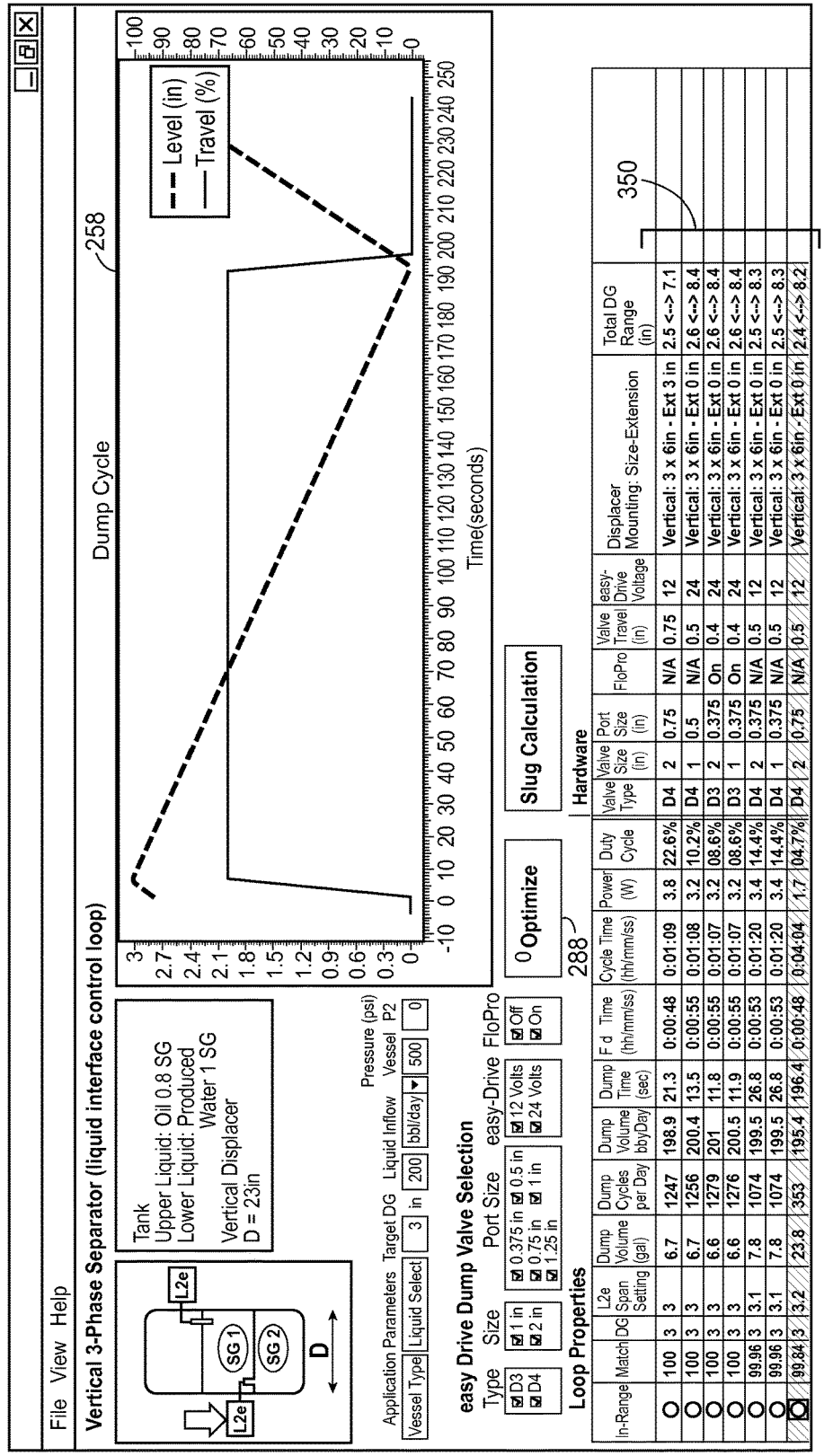
FIG. 12 depicts the example user interface of FIG. 4 displaying yet another set of results.

FIGS. 11 and 12 depict the user interface screen 250, except that different ones of the list of simulation results 350 have been selected and, accordingly, the graph area 258 depicts different dump cycles.

Figure 13:
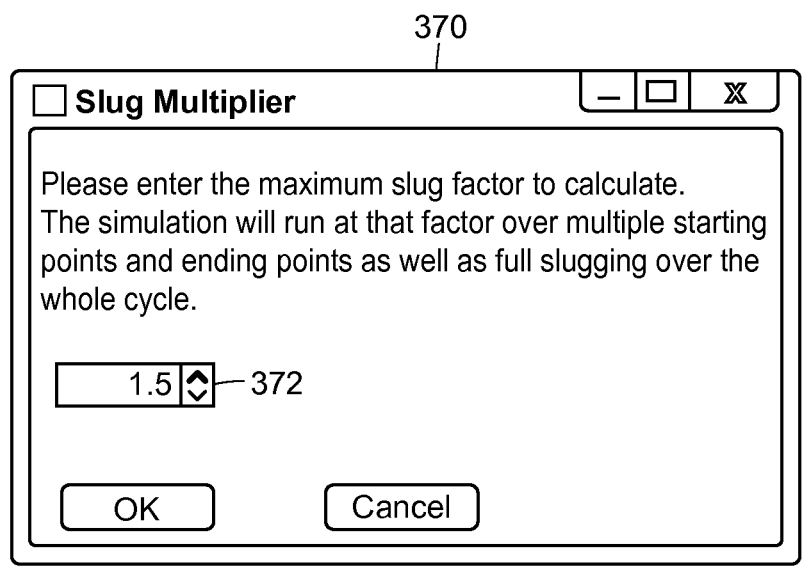
FIG. 13 depicts an example dialog box for entering the parameters of a slug calculation.
Figure 14:
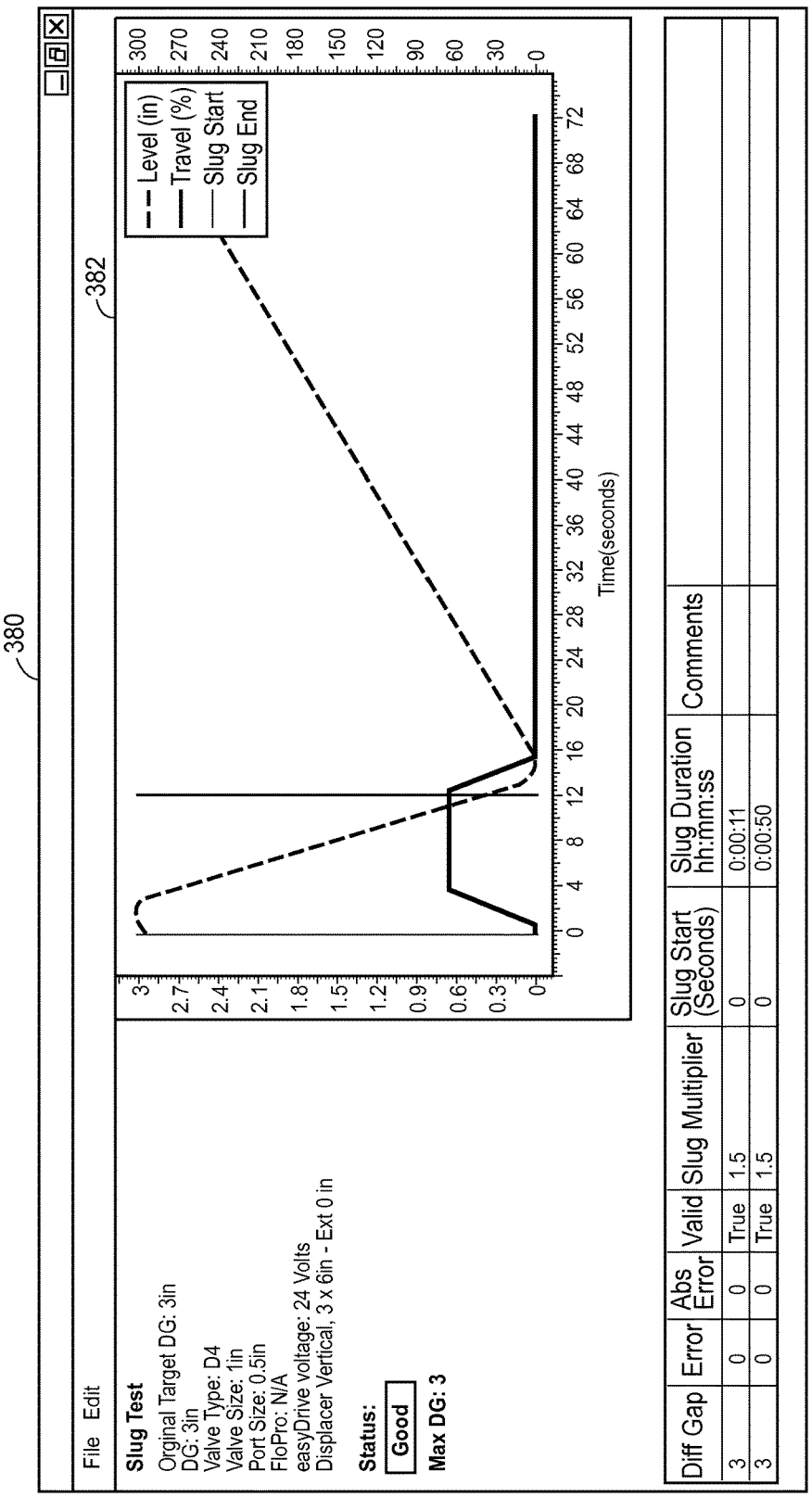
FIG. 14 depicts an example screen displaying the results of a slug calculation.

If the user activates the slug calculation control 290, the user interface 250 may display a dialog box 370 (see FIG. 13), including a control 372 that allows the user to input a maximum slug factor. Upon entering a value in the control 372 and accepting the value (e.g., by activating an "OK" control), the program 190 may perform a slug calculation for a selected result in the list of simulation results 350, and may display a window 380 displaying the results of the slug calculation (see FIG. 14). The window 380 may include a graph 382 showing the fluid level and valve travel as a function of time relative to the duration of the slug.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Unless specifically stated otherwise, discussions herein using words such as "processing," "computing," "calculating," "determining," "identifying," "presenting," "displaying," or the like may refer to actions or processes of a machine (e.g., a computer processor) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

When implemented in software, any of the applications, services, and engines described herein may be stored in any tangible, non-transitory computer readable memory such as on a magnetic disk, a laser disk, solid state memory device, molecular memory storage device, or other storage medium, in a RAM or ROM of a computer or processor, etc. Although the example systems disclosed herein are disclosed as including, among other components, software and/or firmware executed on hardware, it should be noted that such systems are merely illustrative and should not be considered as limiting. For example, it is contemplated that any or all of these hardware, software, and firmware components could be embodied exclusively in hardware, exclusively in software, or in any combination of hardware and software.

Accordingly, persons of ordinary skill in the art will readily appreciate that the examples provided are not the only way to implement such systems.

Thus, while the present invention has been described with reference to specific examples, which are intended to be illustrative only and not to be limiting of the invention, it will be apparent to those of ordinary skill in the art that changes, additions or deletions may be made to the disclosed embodiments without departing from the spirit and scope of the invention.

The following aspects of the disclosure are exemplary only and not intended to limit the scope of the disclosure.

1. A method of optimizing a liquid level control loop, the method comprising: receiving a selection of a vessel type; receiving one or more vessel parameters corresponding to the selected vessel type; receiving one or more flow parameters; receiving a target differential gap parameter; receiving an indication of one or more potential valve and actuator configurations; simulating each of the possible valve and actuator configurations using the received vessel type selection, vessel parameters, and flow parameters; and displaying the results of the simulations.

2. A method according to aspect 1, further comprising eliminating from the possible valve and actuator configurations any ones of the configurations that are determined by the simulation to be unusable given the received vessel type selection, vessel parameters, and flow parameters.

3. A method according to either aspect 1 or aspect 2, further comprising ranking each of the configurations according to the results of the respective simulations.

4. A method according to any one of the preceding aspects, wherein simulating each of the possible valve and actuator configurations comprises determining a simulation time increment for each simulation.

5. A method according to any one of the preceding aspects, wherein determining the simulation time increment for each simulation comprises determining the simulation time increment according to a rate of change of the vessel level.

6. A method according to any one of the preceding aspects, wherein determining the simulation time increment according to the rate of change of the vessel level comprises determining the simulation time increment according to the rate of change of the vessel level when the valve being simulated is open.

7. A method according to any one of the preceding aspects, wherein receiving the indication of one or more potential valve and actuator configurations comprises receiving selections of: at least one valve parameter; and at least one actuator parameter.

8. A method according to any one of the preceding aspects, wherein: receiving a selection of at least one valve parameter comprises receiving a selection of a valve model, receiving a selection of a valve port size, and receiving a selection of a valve size; and receiving a selection of at least one actuator parameter comprises receiving a selection of an actuator operating voltage.

9. A method according to any one of the preceding aspects, wherein the method is operable to optimize a liquid level control loop comprising an electric actuator, an electric level controller, or both.

10. A method according to any one of the preceding aspects, wherein receiving one or more flow parameters comprises receiving a fluid type or a fluid specific gravity.

11. A method according to any one of the preceding aspects, wherein receiving one or more flow parameters comprises receiving an inflow volume per unit time.

12. A method according to any one of the preceding aspects, wherein receiving one or more flow parameters comprises receiving an inlet pressure, a downstream pressure, or both.

13. A method according to any one of the preceding aspects, wherein simulating each of the possible valve and actuator configurations comprises determining, for each of the possible configurations, a target span setting for an electric level controller.

14. A method according to any one of the preceding aspects, wherein simulating each of the possible valve and actuator configurations further comprises determining, for each of the possible configurations, one or more of: a fill cycle time; a dump cycle time; a volume per dump; a power required by the actuator; a number of cycles per unit time; or a dump volume per day.

15. A method according to any one of the preceding aspects, wherein simulating each of the possible configurations comprises determining, for each of the possible configurations, a target span setting for an electric level controller, and further comprising ranking each of the configurations according to the respective determined target spans for the configuration.

16. A method according to any one of the preceding aspects, further comprising: receiving one or more parameters related to slugging events; and considering in the simulations of each of the configurations the slugging events specified by the one or more parameters.

17. A method according to any one of the preceding aspects, further comprising: receiving a selection of a configuration corresponding to one of the displayed results; and displaying for the configuration a graph of the vessel level as a function dump cycle time.

18. A method according to any one of the preceding aspects, further comprising: receiving a selection of a configuration corresponding to one of the displayed results; and displaying for the configuration a graph of the vessel level as a function dump cycle time and of the valve position as a function of dump cycle time.

19. A method according to any one of the preceding aspects, further comprising: receiving a selection of a configuration corresponding to one of the displayed results; and configuring a liquid level control loop according to the selected configuration.

20. A method according to any one of the preceding aspects, further comprising: receiving a selection of a configuration corresponding to one of the displayed results; and automatically placing an order for a set of parts necessary to implement the selected configuration.

21. A method according to any one of the preceding aspects, wherein simulating each of the possible valve and actuator configurations comprises accounting in the simulation for a relationship between liquid level overshoot and liquid level rise rate, a relationship between liquid level undershoot and liquid level fall rate, or both.

What is claimed is:

1. A method of optimizing a liquid level control loop, the method comprising:
    receiving, in a computer processor, a selection of a vessel type;
    receiving, in the computer processor, one or more vessel parameters corresponding to the selected vessel type;
    receiving, in the computer processor, one or more flow parameters;
    receiving, in the computer processor, a target differential gap parameter;
    receiving, in the computer processor, an indication of a plurality of possible valve and actuator configurations each of the valve and actuator configurations having at least a corresponding valve type, a corresponding valve size, a corresponding port size, and a corresponding actuator drive voltage;
    simulating, in the computer processor, each of the plurality of possible valve and actuator configurations using the received vessel type selection, vessel parameters, and flow parameters; and
    displaying results of the simulations.

2. A method according to claim 1, further comprising eliminating from the possible valve and actuator configurations any ones of the configurations that are determined by the simulation to be unusable given the received vessel type selection, vessel parameters, and flow parameters.

3. A method according to claim 1, further comprising ranking each of the configurations according to the results of the respective simulations.

4. A method according to claim 1, wherein simulating each of the possible valve and actuator configurations comprises determining a simulation time increment for each simulation.

5. A method according to claim 4, wherein determining the simulation time increment for each simulation comprises determining the simulation time increment according to a rate of change of the vessel level.

6. A method according to claim 5, wherein determining the simulation time increment according to the rate of change of the vessel level comprises determining the simulation time increment according to the rate of change of the vessel level when the valve being simulated is open.

7. A method according to claim 1, wherein the method is operable to optimize a liquid level control loop comprising an electric actuator, an electric level controller, or both.

8. A method according to claim 1, wherein receiving one or more flow parameters comprises receiving a fluid type or a fluid specific gravity.

9. A method according to claim 1, wherein receiving one or more flow parameters comprises receiving an inflow volume per unit time.

10. A method according to claim 1, wherein receiving one or more flow parameters comprises receiving an inlet pressure, a downstream pressure, or both.

11. A method according to claim 1, wherein simulating each of the possible valve and actuator configurations comprises determining, for each of the possible configurations, a target span setting for an electric level controller.

12. A method according to claim 11, wherein simulating each of the possible valve and actuator configurations further comprises determining, for each of the possible configurations, one or more of:
    a fill cycle time;
    a dump cycle time;
    a volume per dump;
    a power required by the actuator;
    a number of cycles per unit time; or
    a dump volume per day.

13. A method according to claim 1, wherein simulating each of the possible configurations comprises determining, for each of the possible configurations, a target span setting for an electric level controller, and further comprising ranking each of the configurations according to the respective determined target spans for the configuration.

14. A method according to claim 1, further comprising:
    receiving one or more parameters related to slugging events; and considering in the simulations of each of the configurations the slugging events specified by the one or more parameters.

15. A method according to claim 1, further comprising:
receiving a selection of a configuration corresponding to one of the displayed results; and
displaying for the configuration a graph of the vessel level as a function dump cycle time.

16. A method according to claim 1, further comprising:
receiving a selection of a configuration corresponding to one of the displayed results; and
displaying for the configuration a graph of the vessel level as a function dump cycle time and of the valve position as a function of dump cycle time.

17. A method according to claim 1, further comprising:
receiving a selection of a configuration corresponding to one of the displayed results; and
configuring a liquid level control loop according to the selected configuration.

18. A method according to claim 1, further comprising:
receiving a selection of a configuration corresponding to one of the displayed results; and
automatically placing an order for a set of parts necessary to implement the selected configuration.

19. A method according to claim 1, wherein simulating each of the possible valve and actuator configurations comprises accounting in the simulation for a relationship between liquid level overshoot and liquid level rise rate, a relationship between liquid level undershoot and liquid level fall rate, or both.

* * * * *